(12) United States Patent
Ryoo et al.

(10) Patent No.: US 8,716,062 B1
(45) Date of Patent: May 6, 2014

(54) ARRAY SUBSTRATE AND METHOD OF FABRICATING THE SAME

(71) Applicant: LG Display Co., Ltd., Seoul (KR)

(72) Inventors: Chang-Il Ryoo, Paju-si (KR); Hyun-Sik Seo, Goyang-si (KR); Jong-Uk Bae, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/146,937

(22) Filed: Jan. 3, 2014

Related U.S. Application Data

(62) Division of application No. 13/923,019, filed on Jun. 20, 2013, which is a division of application No. 13/115,733, filed on May 25, 2011, now Pat. No. 8,497,147.

(30) Foreign Application Priority Data

May 28, 2010 (KR) .......................... 10-2010-0050457

(51) Int. Cl.
*H01L 21/00* (2006.01)

(52) U.S. Cl.
USPC .......................................... 438/104; 438/158

(58) Field of Classification Search
CPC .................................................. H01L 29/7869
USPC .................................................. 438/104, 158
See application file for complete search history.

(56) References Cited

U.S. PATENT DOCUMENTS

| | | | |
|---|---|---|---|
| 7,799,622 B2 | 9/2010 | Jung et al. |
| 7,994,510 B2 | 8/2011 | Jeong et al. |
| 2009/0141203 A1 | 6/2009 | Son et al. |
| 2009/0305473 A1 | 12/2009 | Luo et al. |
| 2009/0315026 A1 | 12/2009 | Jeong et al. |

FOREIGN PATENT DOCUMENTS

| | | |
|---|---|---|
| KR | 10-2009-0124527 A | 12/2009 |
| TW | 200952178 | 12/2009 |

*Primary Examiner* — Douglas Menz
(74) *Attorney, Agent, or Firm* — Birch, Stewart, Kolasch & Birch, LLP

(57) ABSTRACT

A method of fabricating an array substrate and a display device including the array substrate are discussed. According to an embodiment, the array substrate includes a gate electrode formed on a substrate; a gate insulating layer formed on the gate electrode; an oxide semiconductor layer and an etch prevention layer formed on the gate insulating layer, wherein ends of the oxide semiconductor layer and ends of the etch prevention layer are aligned with each other; source and drain electrodes formed on the etch prevention layer; a passivation layer including a contact hole formed on the source and drain electrodes and on the gate insulating layer; and a pixel electrode formed on the passivation layer and through the contact hole.

8 Claims, 15 Drawing Sheets

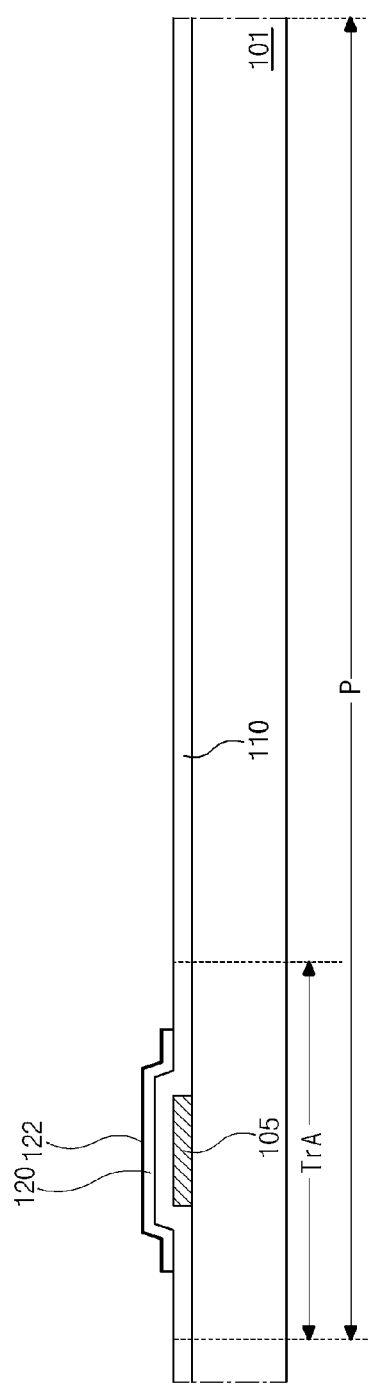
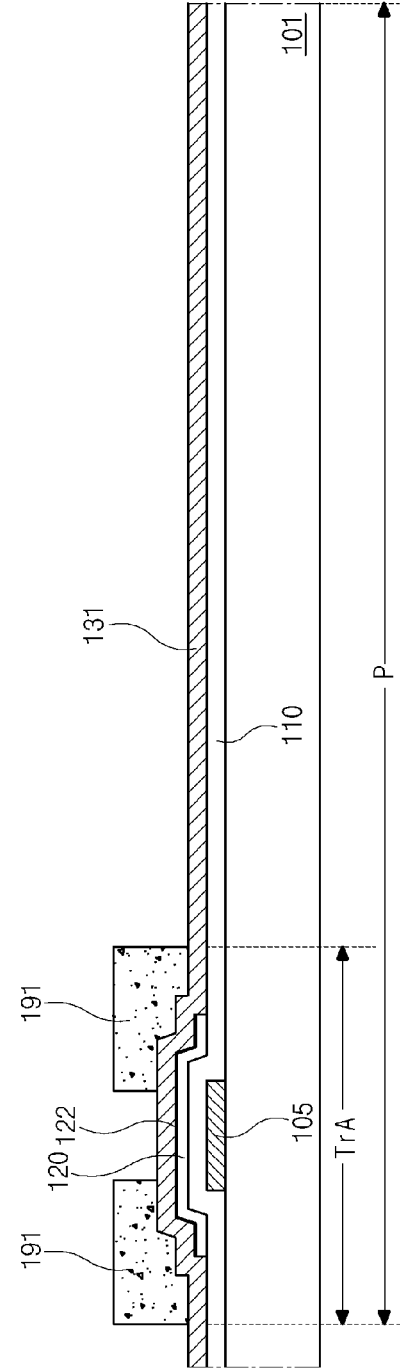

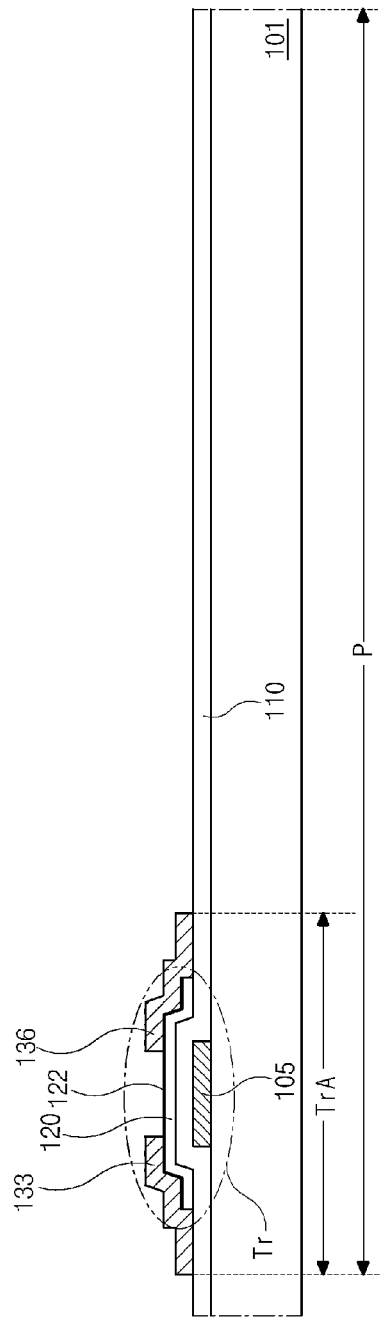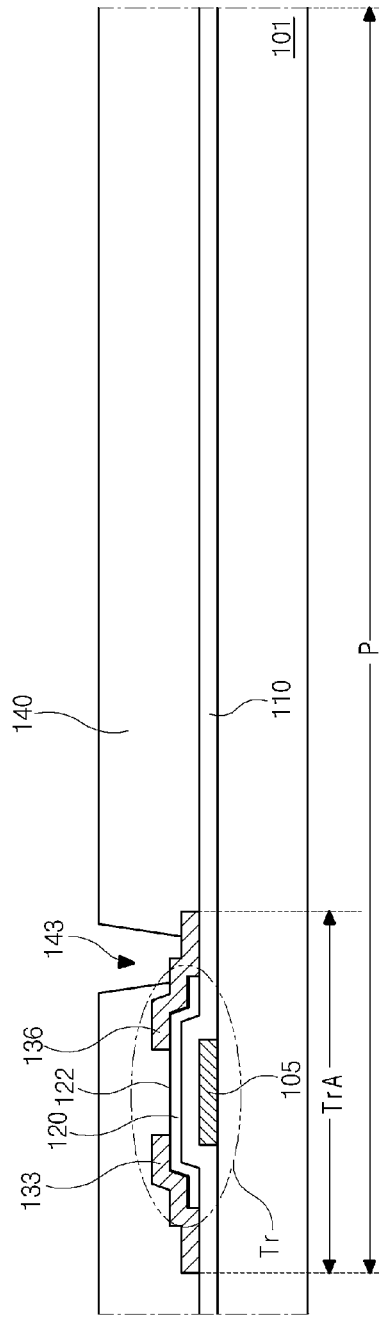

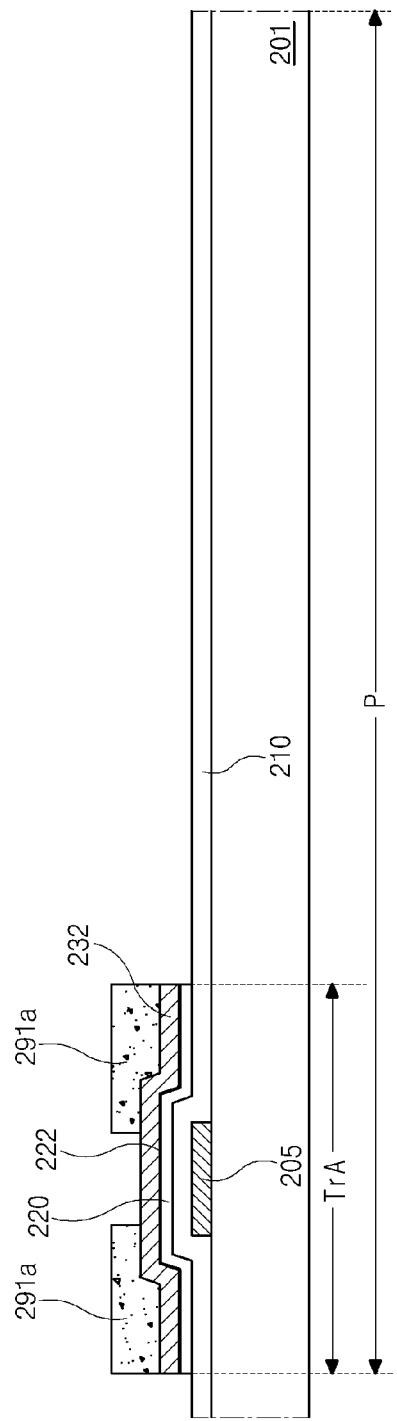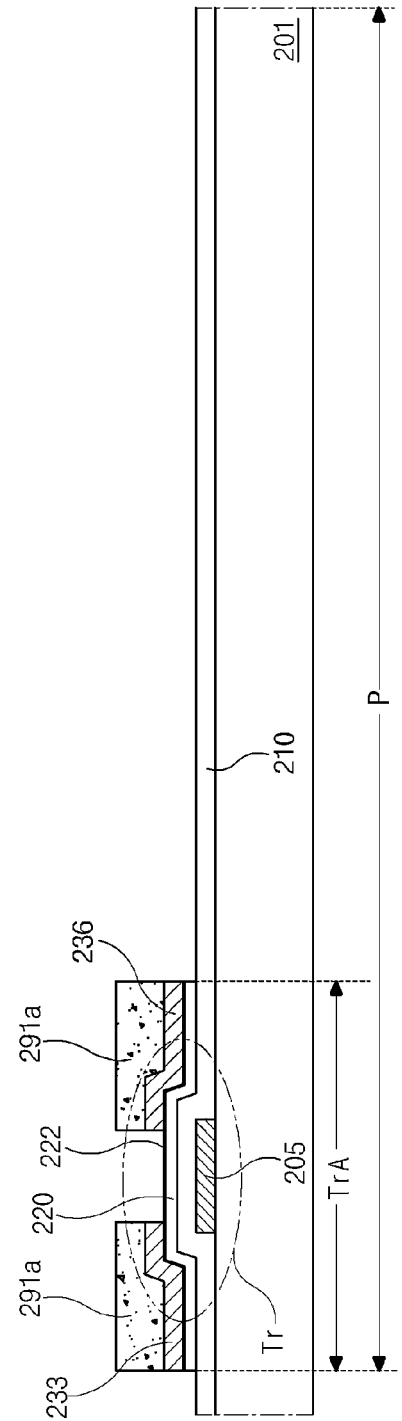

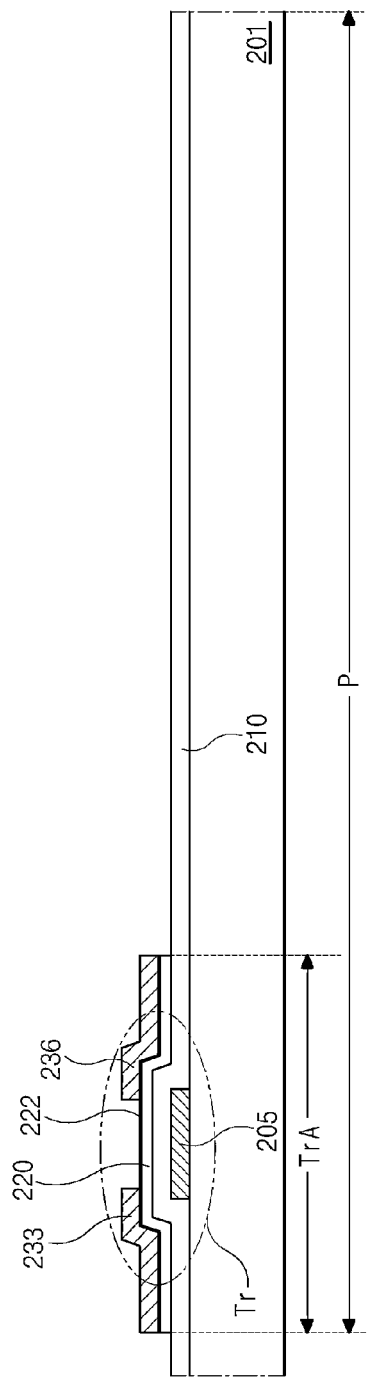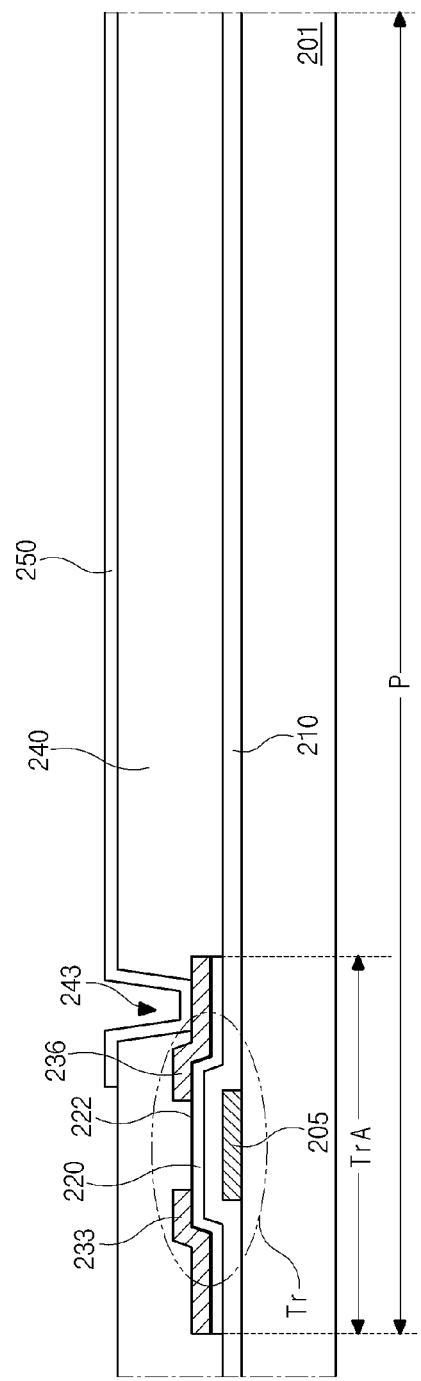

ARRAY SUBSTRATE AND METHOD OF FABRICATING THE SAME

This application is a Divisional of co-pending application Ser. No. 13/923,019 filed Jun. 20, 2013, which is a Divisional of application Ser. No. 13/115,733 (now U.S. Pat. No. 8,497,147) filed May 25, 2011, which claims the priority benefit of Korean Patent Application No. 10-2010-0050457, filed on May 28, 2010. The entire contents of all the above applications are hereby incorporated by reference.

BACKGROUND OF THE INVENTION

1. Field of the Invention

The present invention relates to an array substrate, and more particularly, to an array substrate including a thin film transistor with an oxide semiconductor layer and a method of fabricating the same.

2. Discussion of the Related Art

With rapid development of information technologies, display devices for displaying a large amount of information have been promptly developed. More particularly, flat panel display (FPD) devices having a thin profile, light weight and low power consumption such as organic electroluminescent display (OLED) devices and liquid crystal display (LCD) devices have been actively pursued and are replacing the cathode ray tubes (CRTs).

Among the liquid crystal display devices, active matrix type liquid crystal display devices, which include thin film transistors to control on/off the respective pixels, have been widely used because of their high resolution, color rendering capability and superiority in displaying moving images.

In addition, organic electroluminescent display devices have been recently spotlighted because they have many merits as follows: the organic electroluminescent display devices have high brightness and low driving voltages; because they are self-luminous, the organic electroluminescent display devices have excellent contrast ratios and ultra thin thicknesses; the organic electroluminescent display devices have a response time of several micro seconds, and there are advantages in displaying moving images; the organic electroluminescent display devices have wide viewing angles and are stable under low temperatures; since the organic electroluminescent display devices are driven by a low voltage of direct current (DC) 5V to 15V, it is easy to design and manufacture driving circuits; and the manufacturing processes of the organic electroluminescent display device are simple since only deposition and encapsulation steps are required. In the organic electroluminescent display devices, active matrix type display devices also have been widely used because of their low power consumption, high definition and large-sized possibility.

Each of the active matrix type liquid crystal display devices and the active matrix type organic electroluminescent display devices includes an array substrate having thin film transistors as switching elements to control on/off their respective pixels.

FIG. 1 is a cross-sectional view of illustrating an array substrate for a liquid crystal display device or for an organic electroluminescent display device according to the related art. FIG. 1 shows a cross-sectional view of a pixel region including a thin film transistor in the array substrate.

In FIG. 1, gate lines (not shown) and data lines 33 are formed on a substrate 11 and cross each other to define pixel regions P. A gate electrode 15 is formed at a switching region TrA of each pixel region P. A gate insulating layer 18 is formed on the gate electrode 15, and a semiconductor layer 28, which includes an active layer 22 of intrinsic amorphous silicon and ohmic contact layers 26 of impurity-doped amorphous silicon, is formed on the gate insulating layer 18. Source and drain electrodes 36 and 38 are formed on the ohmic contact layers 26. The source and drain electrodes 36 and 38 correspond to the gate electrode 15 and are spaced apart from each other. The gate electrode 15, the gate insulating layer 18, the semiconductor layer 28, and the source and drain electrodes 36 and 38 sequentially formed at the switching region TrA constitute a thin film transistor Tr.

A passivation layer 42 is formed on the source and drain electrodes 36 and 38 and the exposed active layer 22. The passivation layer 42 has a drain contact hole 45 exposing a portion of the drain electrode 38. A pixel electrode 50 is formed independently in each pixel region P on the passivation layer 42. The pixel electrode 50 contacts the drain electrode 38 through the drain contact hole 45. Here, a semiconductor pattern 29 is formed under the data line 33. The semiconductor pattern 29 has a double-layered structure including a first pattern 27 of the same material as the ohmic contact layers 26 and a second pattern 23 of the same material as the active layer 22.

In the semiconductor layer 28 formed at the switching region TrA of the related art array substrate, the active layer 22 of intrinsic amorphous silicon has different thicknesses depending on the position. That is, a portion of the active layer 22 exposed by selectively removing the ohmic contact layers 26 has a first thickness t1 and a portion of the active layer 22 under the ohmic contact layers 26 has a second thickness t2, which is thicker than the first thickness t1. The different thicknesses of the different portions of the active layer 22 are caused by a manufacturing method, and this decreases the output characteristics of the thin film transistor Tr and negatively affects the performance of the thin film transistor Tr because the active layer 22 between the source and drain electrodes 36 and 38, which becomes a channel of the thin film transistor Tr, has a reduced thickness.

To address this problem, a thin film transistor having an oxide semiconductor layer of a single layer, which does not need the related art ohmic contact layers and which uses an oxide semiconductor material as an active layer, has been developed.

FIG. 2 is a cross-sectional view of an array substrate including a thin film transistor having such an oxide semiconductor layer according to the related art. In FIG. 2, the thin film transistor Tr is formed on a substrate 51 and includes a gate electrode 53, source and drain electrodes 57 and 59, and an oxide semiconductor layer 61. A gate insulating layer 55 is disposed between the gate electrode 53 and the source and drain electrodes 57 and 59. A passivation layer 63 covers the thin film transistor Tr and has a contact hole 65 exposing the drain electrode 59. A pixel electrode 67 is formed on the passivation layer 63 and is connected to the drain electrode 59 through the contact hole 65.

In the thin film transistor Tr of FIG. 2 having the oxide semiconductor layer 61, ohmic contact layers are not required and are not provided, and thus the oxide semiconductor layer 61 is not exposed to etching gases used in a dry-etching process. Therefore, lowering of the output characteristics of the thin film transistor Tr is prevented or minimized.

On the other hand, since the oxide semiconductor layer 61 does not have an etch selectivity to a metal layer, the oxide semiconductor layer 61 may be removed or damaged by an etchant for etching the metal layer when the oxide semiconductor layer 61 is exposed to the etchant. The characteristics and performance of the thin film transistor may be negatively affected.

Accordingly, in FIG. 2, the thin film transistor Tr has a structure in which the source and drain electrodes 57 and 59 are formed, and then the oxide semiconductor layer 61 is formed on the source and drain electrodes 57 and 59.

However, in the thin film transistor Tr having the oxide semiconductor layer 61 on the source and drain electrodes 57 and 59, which are formed of a metallic material, there may be a problem such as poor adhesion.

In addition, as shown in the enlarged region A in FIG. 2, the oxide semiconductor layer 61 may be disconnected or may be very thin around the sides of the source and drain electrodes 57 and 59 facing each other due to the step profile at a region including a portion of the gate insulating layer 55 exposed between the source and drain electrodes 57 and 59, and at portions of the source and drain electrodes 57 and 59. Therefore, the thickness of the oxide semiconductor layer 61 is not uniform, and the performance characteristics of the thin film transistor Tr are lowered.

In view of these limitations of the thin film transistors of FIGS. 2 and 3, an etch stopper has been introduced to prevent an oxide semiconductor layer from being exposed to an etchant. FIG. 3 is a cross-sectional view of an array substrate including a thin film transistor having an oxide semiconductor layer and an etch stopper according to the related art.

In FIG. 3, the thin film transistor Tr is formed on a substrate 71 and includes a gate electrode 73, source and drain electrodes 81 and 83, and an oxide semiconductor layer 77. The thin film transistor Tr further includes an etch stopper 79 on the oxide semiconductor layer 77 between the source and drain electrodes 81 and 83 such that a central portion of the oxide semiconductor layer 77 is not exposed to an etchant when the source and drain electrodes 81 and 83 are formed. The etch stopper 79 may be formed of an inorganic insulating material.

A gate insulating layer 75 is disposed between the gate electrode 73 and the oxide semiconductor layer 77. A passivation layer 85 covers the thin film transistor Tr and has a contact hole 87 exposing a portion of the drain electrode 83. A pixel electrode 89 is formed on the passivation layer 85 and is connected to the drain electrode 83 through the contact hole 87.

However, the array substrate of FIG. 3 including the thin film transistor Tr that has the oxide semiconductor layer 77 and the etch stopper 79 thereon is manufactured through a mask method composed of six (6) mask processes where one mask process is added to form the etch stopper 79. That is, there are six mask processes involved in the related art mask method for forming the array substrate, where a first mask process is used for forming the gate electrode, a second mask process is used for forming the oxide semiconductor layer, a third mask process is used for forming the etch stopper, a fourth mask process is used for forming the source and drain electrodes, a fifth mask process is used for forming the contact hole in the drain electrode, and a sixth mask process is used for forming the pixel electrode.

However, each of these six mask processes includes the steps of applying a photoresist material on a layer desired to pattern, exposing the photoresist material to light though a single photo mask, developing the light-exposed photoresist material and thereby forming a photoresist pattern, etching the layer using the photoresist pattern, and stripping the photoresist pattern. Thus, each mask process is complicated and many chemical solutions are used. As such, as the number of mask processes in the mask method increases, the manufacturing time lengthens. Therefore, in the related art method and device, the productivity is lowered, more defects are generated, and the manufacturing costs are raised.

Accordingly, in the array substrate of FIG. 3 according to the related art, there is a need to lower the manufacturing cost of the array substrate as well as to simplify the mask method by reducing the number of mask processes in the mask method for forming the thin film transistors.

SUMMARY OF THE INVENTION

Accordingly, the present invention is directed to an array substrate including an oxide semiconductor layer and a method of fabricating the same that substantially obviate one or more of the problems due to limitations and disadvantages of the related art.

An object of the present invention is to provide an array substrate including an oxide semiconductor layer and a method of fabricating the same that prevent the oxide semiconductor layer from being damaged by an etchant for patterning a metal layer and reduce the manufacturing processes and costs.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating an array substrate according to an embodiment includes forming a gate electrode on a substrate; forming a gate insulating layer on the gate electrode; forming an oxide semiconductor layer and an etch prevention layer on the gate insulating layer using a single mask; forming source and drain electrodes on the etch prevention layer; and forming a passivation layer including a contact hole on the source and drain electrodes and on the gate insulating layer; and forming a pixel electrode on the passivation layer and through the contact hole.

In another aspect, a method of fabricating an array substrate, includes forming a gate electrode on a substrate; forming a gate insulating layer on the gate electrode; forming an oxide semiconductor layer material on the gate insulating layer; turning an upper portion of the oxide semiconductor layer material into an etch prevention layer material; forming a metal layer on the etch prevention layer material; forming an oxide semiconductor layer, an etch prevention layer, and source and drain electrodes by patterning the oxide semiconductor layer material, the etch prevention layer material and the metal layer using a single mask; forming a passivation layer including a contact hole on the source and drain electrodes and the gate insulating layer; and forming a pixel electrode on the passivation layer and through the contact hole.

In another aspect, an array substrate for a display device, the array substrate, includes a gate electrode formed on a substrate; a gate insulating layer formed on the gate electrode; an oxide semiconductor layer and an etch prevention layer formed on the gate insulating layer, wherein ends of the oxide semiconductor layer and ends of the etch prevention layer are aligned with each other; source and drain electrodes formed on the etch prevention layer; a passivation layer including a contact hole formed on the source and drain electrodes and on the gate insulating layer; and a pixel electrode formed on the passivation layer and through the contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIGS. 4A to 4I are cross-sectional views of illustrating a formation of an array substrate including a thin film transistor with an oxide semiconductor layer according to a first embodiment of the present invention.

FIGS. 6A to 6H are cross-sectional views of illustrating a formation of an array substrate including a thin film transistor with an oxide semiconductor layer according to a second embodiment of the present invention.

DETAILED DESCRIPTION OF THE ILLUSTRATED EMBODIMENTS

Reference will now be made in detail to embodiments of the present invention, examples of which are illustrated in the accompanying drawings. Wherever possible, similar reference numbers will be used to refer to the same or similar parts.

According to the present invention, a single mask process includes the steps of applying a photoresist material on one or more layers desired to pattern, exposing the photoresist material to light though a single photo mask, developing the light-exposed photoresist material and thereby forming a photoresist pattern, etching the layer(s) using the photoresist pattern, and stripping the photoresist pattern. As a result, in a single mask process, the layer(s) can be patterned using a single mask.

FIGS. 4A to 4I are cross-sectional views of illustrating a formation of an array substrate including a thin film transistor with an oxide semiconductor layer according to a first embodiment of the present invention. The array substrate shown in FIGS. 4A-4I or in the subsequent figures corresponds to an array substrate of a liquid crystal display device or of an organic electroluminescent display device, but can be an array substrate in other types of devices. The array substrate includes a plurality of thin film transistors each with an oxide semiconductor layer according to the invention. In this regard, FIGS. 4A to 4I show a pixel region including such a thin film transistor. For convenience of explanation, a region for the thin film transistor is defined as a switching region TrA.

Figure 1:
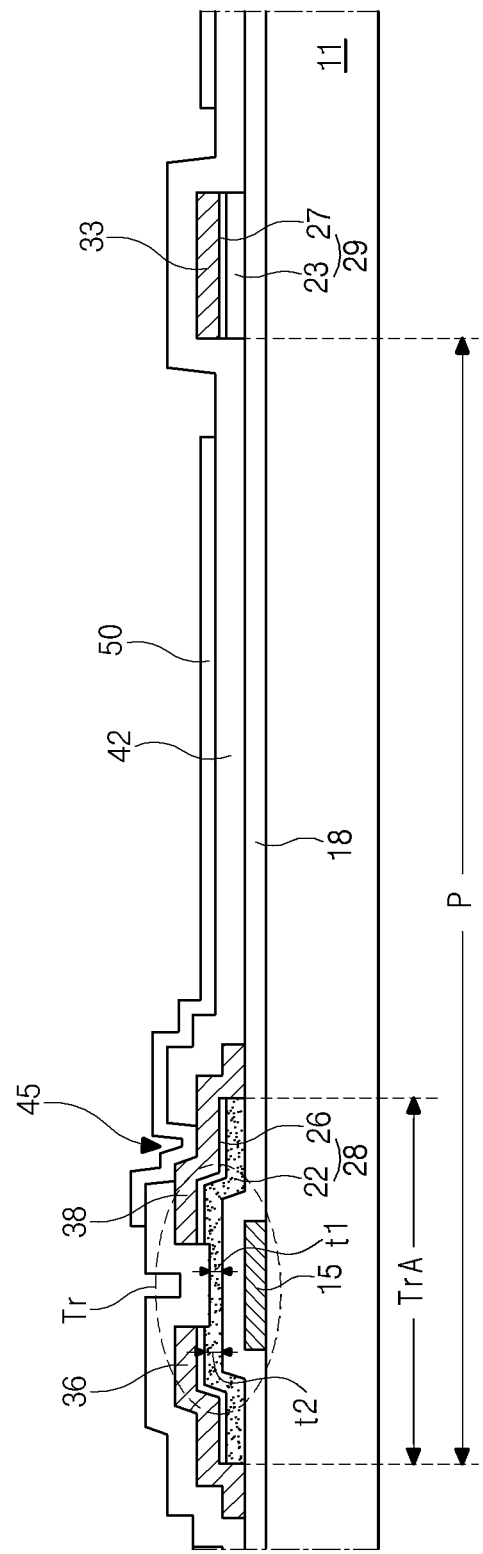
FIG. 1 is a cross-sectional view of illustrating an array substrate for a liquid crystal display device or an organic electroluminescent display device according to the related art.
Figure 2:
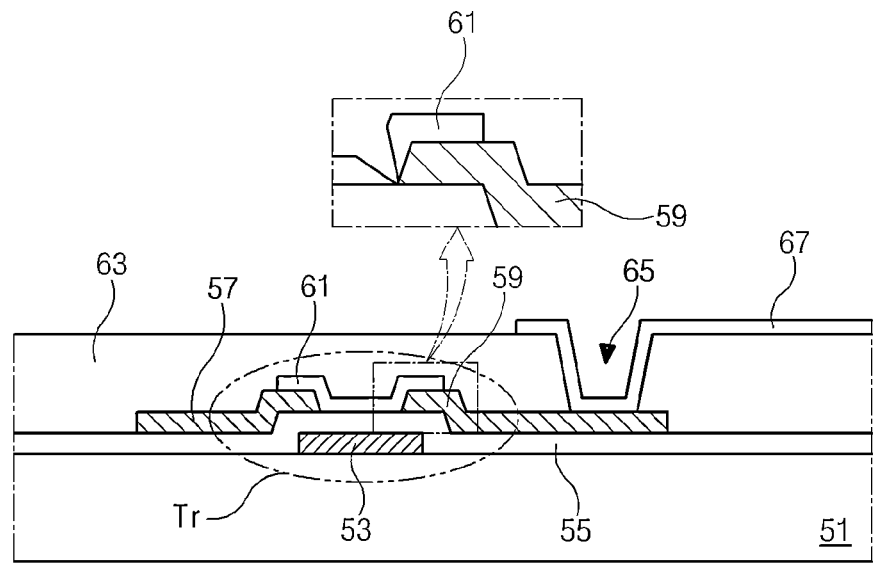
FIG. 2 is a cross-sectional view of an array substrate including a thin film transistor having an oxide semiconductor layer according to the related art.
Figure 3:
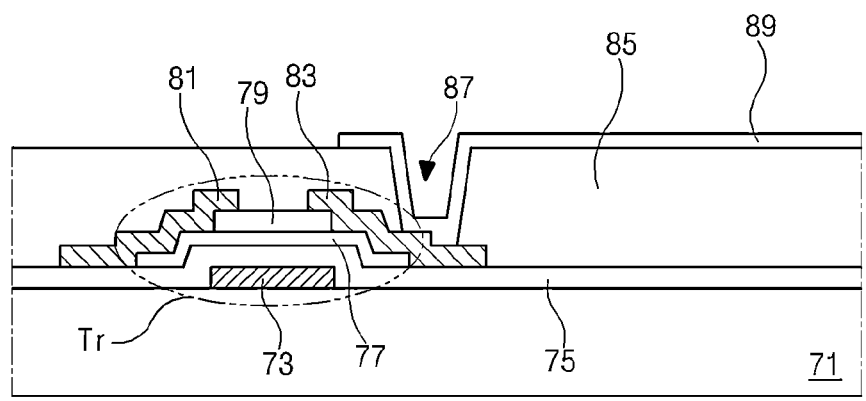
FIG. 3 is a cross-sectional view of an array substrate including a thin film transistor having an oxide semiconductor layer and an etch stopper according to the related art.
Figure 4A:
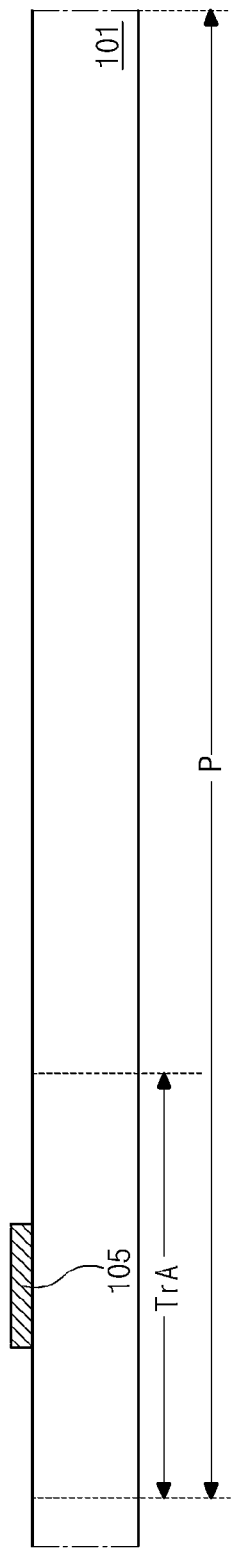

In FIG. 4A, a first metal layer is formed on a transparent insulating substrate 101 by depositing a first metallic material and then is patterned through a mask process, thereby forming a gate line and a gate electrode 105. The gate line is formed along a first direction at a border of a pixel region P. The gate electrode 105 extends from the gate line and is disposed at the switching region TrA. The gate line and the gate electrode 105 may have a single-layered structure or a double-layered structure, and in FIG. 4A, the gate line and the gate electrode 105 has a single-layered structure, for example. The substrate 101 may be a glass substrate or a plastic substrate. The first metallic material may be one or more selected from copper (Cu), copper alloy, aluminum (Al), aluminum alloy such as aluminum neodymium (AlNd), molybdenum (Mo) and molybdenum ally such as molybdenum titanium (MoTi). The mask process may include the steps of applying photoresist, exposing the photoresist to light, developing the light-exposed photoresist and etching the first metal layer.

Figure 4B:
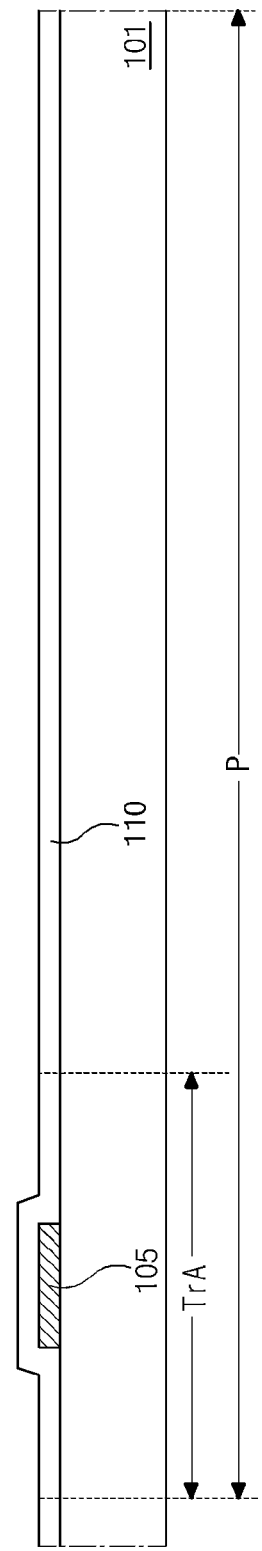

In FIG. 4B, a gate insulating layer 110 is formed on the gate line and the gate electrode 105 by depositing an inorganic insulating material, for example, silicon oxide ($SiO_2$) or silicon nitride ($SiN_x$) on a substantially entire surface of the substrate 101.

Figure 4C:
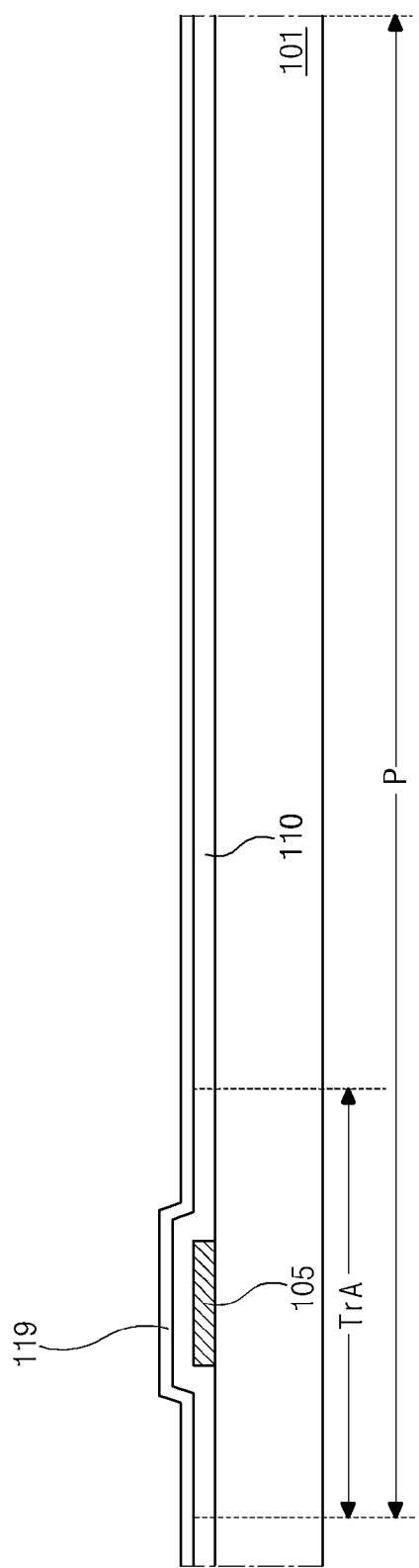

Next, in FIG. 4C, an oxide semiconductor layer material 119 is formed on the gate insulating layer 110 by depositing an oxide semiconductor material, for example, indium gallium zinc oxide (IGZO) or zinc tin oxide (ZTO), by a sputtering method.

Figure 4D:
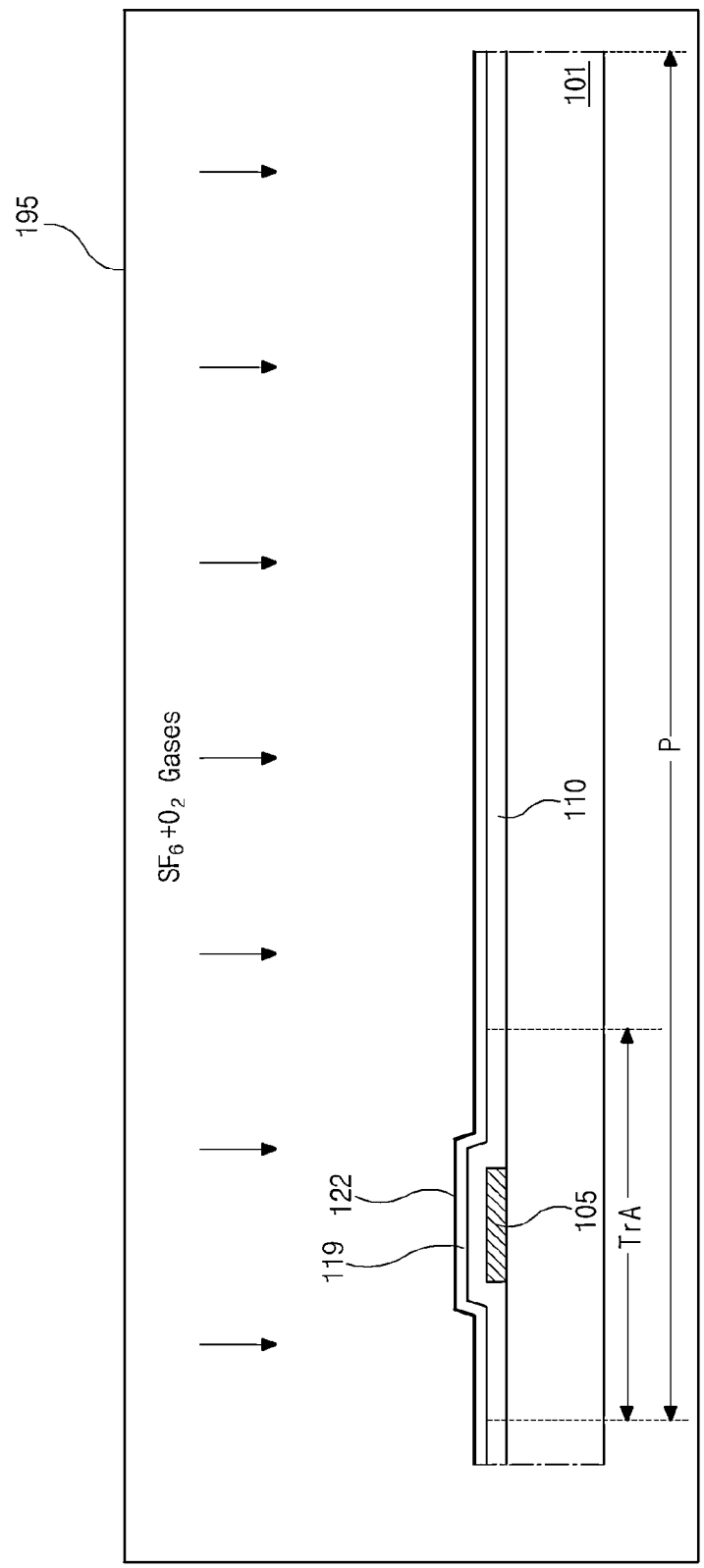

In FIG. 4D, the substrate 101 including the oxide semiconductor layer material 119 thereon is disposed in a vacuum chamber 195. The top surface of the oxide semiconductor layer material 119 is treated by supplying sulfur hexafluoride ($SF_6$) and oxygen ($O_2$) gases to the vacuum chamber 195 and generating plasma.

Here, to generate the plasma, a power supplied to the vacuum chamber 195 may be 0.5 kW to 10 kW, a flow rate of sulfur hexafluoride ($SF_6$) may be 10 sccm to 3000 sccm, a flow rate of oxygen ($O_2$) may be 20 sccm to 6000 sccm, and a pressure of the inside of the vacuum chamber 195 may be 50 mTorr to 300 mTorr. It is desirable that a mixing rate of sulfur hexafluoride ($SF_6$) to oxygen ($O_2$) may be 1:2 or 1:3.

Sulfur hexafluoride ($SF_6$) reacts with the oxide semiconductor layer material 119, and an upper portion of the oxide semiconductor layer material 119 is turned into an etch-prevention layer 122, whereby the etch-prevention layer 122 having a predetermined thickness is formed at the top surface of the oxide semiconductor layer material 119 to prevent the oxide semiconductor layer material 119 from reacting with an etchant. Oxygen ($O_2$) prevents oxygen of the oxide semiconductor layer material 119, which includes oxygen therein, from coming out of the oxide semiconductor layer material 119 to thereby deteriorate semiconductor properties during the plasma treatment.

Therefore, the etch-prevention layer 122 having a certain thickness is formed at the top surface of the oxide semiconductor layer material 119 by plasma-treating the oxide semiconductor layer material 119, and the oxide semiconductor layer material 119 is not affected by the etchant for etching a metallic material due to the etch-prevention layer 122 because the etch-prevention layer 122 has an increased resistant property to the etchant. Here, the thickness of the formed etch-prevention layer 122 may range within, e.g., 1 nm to 20 nm, and preferably, the thickness of the etch-prevention layer 122 may range from 3 nm to 9 nm. The etc-prevention layer in this and other embodiments is a layer which is formed to prevent etching of the oxide semiconductor layer/material when source and drain electrodes are formed.

In FIG. 4E, the oxide semiconductor layer material 119 of FIG. 4D including the etch-prevention layer 122 at the top surface is patterned through a mask process, and an oxide semiconductor layer 120 of an island shape is formed at the switching region TrA. The oxide semiconductor layer 120 corresponds to and overlaps the gate electrode 105.

Figure 5:
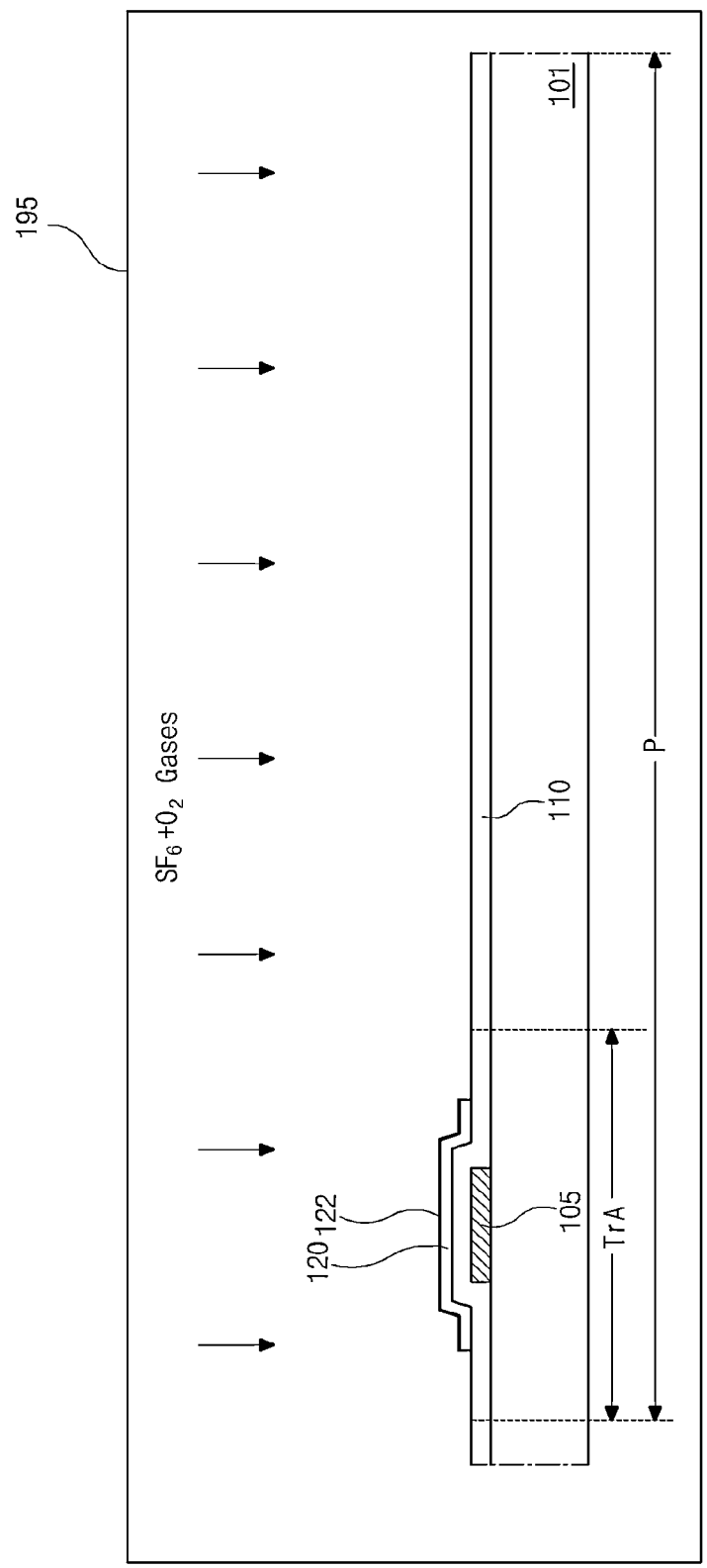
FIG. 5 is a cross-sectional view of illustrating an array substrate including a thin film transistor with an oxide semiconductor layer according to another example of the first embodiment of the present invention.

In the first embodiment, the oxide semiconductor layer material 119 formed on a substantially entire surface of the substrate 101 is treated by sulfur hexafluoride ($SF_6$) and oxygen ($O_2$) plasma and then is patterned to form the oxide semiconductor layer 120. On the other hand, the plasma treatment may be performed after the oxide semiconductor layer material 119 is patterned. FIG. 5 is a cross-sectional view of illustrating an array substrate including such a thin film transistor with an oxide semiconductor layer according to another example of the first embodiment of the present invention. As shown in FIG. 5, after the oxide semiconductor layer 120 is formed at the switching region TrA by patterning an oxide semiconductor material layer, the plasma treatment using sulfur hexafluoride ($SF_6$) and oxygen ($O_2$) gases may be carried out, and an etch-prevention layer 122 may be formed at the top surface of the oxide semiconductor layer 120.

Next, in FIG. 4F, a second metal layer 131 is formed on the oxide semiconductor layer 120 by depositing one or more selected from a metallic material group including copper (Cu), copper alloy, aluminum (Al), aluminum alloy such as aluminum neodymium (AlNd), molybdenum (Mo) and molybdenum ally such as molybdenum titanium (MoTi). The second metal layer 131 may have a single-layered structure or a double-layered structure, and in this figure, the second metal layer 131 has a single-layered structure, for example.

Then, photoresist is applied on the second metal layer 131, exposed to light through a mask, and developed, thereby forming photoresist patterns 191 on the second metal layer 131. The photoresist patterns 191 correspond to areas where a data line, a source electrode and a drain electrode are to be formed.

In FIG. 4G, the second metal layer 131 of FIG. 4F exposed by the photoresist patterns 191 is exposed to an etchant by using the photoresist patterns 191 of FIG. 4F as an etching mask. Portions of the second metal layer 131 of FIG. 4F exposed to the etchant react with the etchant and are removed. Portions of the second metal layer 131 of FIG. 4F shielded by the photoresist patterns 191 of FIG. 4F are not exposed to the etchant and remain on the substrate 101. Therefore, the second metal layer 131 of FIG. 4F exposed between the photoresist patterns 191 of FIG. 4F at the switching region TrA are removed, and thus a central portion of the oxide semiconductor layer 120 is exposed.

Here, the exposed central portion of the oxide semiconductor layer 120 contacts the etchant for removing the second metal layer 131 of FIG. 4F. However, the oxide semiconductor layer 120 is treated by plasma of sulfur hexafluoride (SF6) and oxygen ($O_2$) gases, and the etch-prevention layer 122 is formed at the top surface of the oxide semiconductor layer 120. Thus, the oxide semiconductor layer 120 does not react with the etchant. Accordingly, the oxide semiconductor layer 120 is not removed at all and the inside of the oxide semiconductor layer 120 is not damaged by the etchant.

After the etching process according to the above-mentioned steps, a data line (not shown) and source and drain electrodes 133 and 136 are formed on the substrate 101. The data line is formed along a second direction and crosses the gate line to define the pixel region P. The source and drain electrodes 133 and 136 are disposed at the switching region TrA and are spaced apart from each other on the oxide semiconductor layer 120. The source electrode 133 is connected to the data line.

The gate electrode 105, the gate insulating layer 110, the oxide semiconductor layer 120, and the source and drain electrodes 133 and 136 constitute a thin film transistor Tr, a switching element.

The oxide semiconductor layer 120 has an ohmic contact property with the metallic material and does not require an ohmic contact layer of impurity-doped amorphous silicon differently from a semiconductor layer of intrinsic amorphous silicon. Therefore, the oxide semiconductor layer 120 has a single-layered structure in the thin film transistor Tr according to the invention while the related art semiconductor layer has a double-layered structure of an active layer of intrinsic amorphous silicon and ohmic contact layers of impurity-doped amorphous silicon.

The thin film transistor Tr having the single-layered oxide semiconductor layer 120 does not need an additional dry etching step for removing the impurity-doped amorphous silicon layer between the source and drain electrodes 133 and 136 to form the ohmic contact layers after forming the source and drain electrodes 133 and 136. Therefore, the oxide semiconductor layer 120 is not damaged by the dry etching step, and the characteristics of the thin film transistors Tr are not deteriorated.

Then, the photoresist patterns 191 of FIG. 4F on the source and drain electrodes 133 and 136 are stripped and removed, thereby exposing the data line and the source and drain electrodes 133 and 136 as shown in FIG. 4G.

In FIG. 4H, a passivation layer 140 is formed on the data line and the source and drain electrodes 133 and 136 by depositing an inorganic insulating material such as silicon oxide ($SiO_2$) or silicon nitride ($SiN_X$), or applying an organic insulating material such as benzocyclobutene (BCB) or photo acryl. In the figure, the passivation layer 140 is formed of an organic insulating material and has an even surface, for example. If the passivation layer 140 is formed of an inorganic material, the passivation layer 140 may have an uneven surface due to the steps of the layers under the passivation layer 140.

The passivation layer 140 is patterned through a mask process, thereby forming a drain contact hole 143 exposing a part of the drain electrode 136 at the switching region TrA.

Figure 4I:
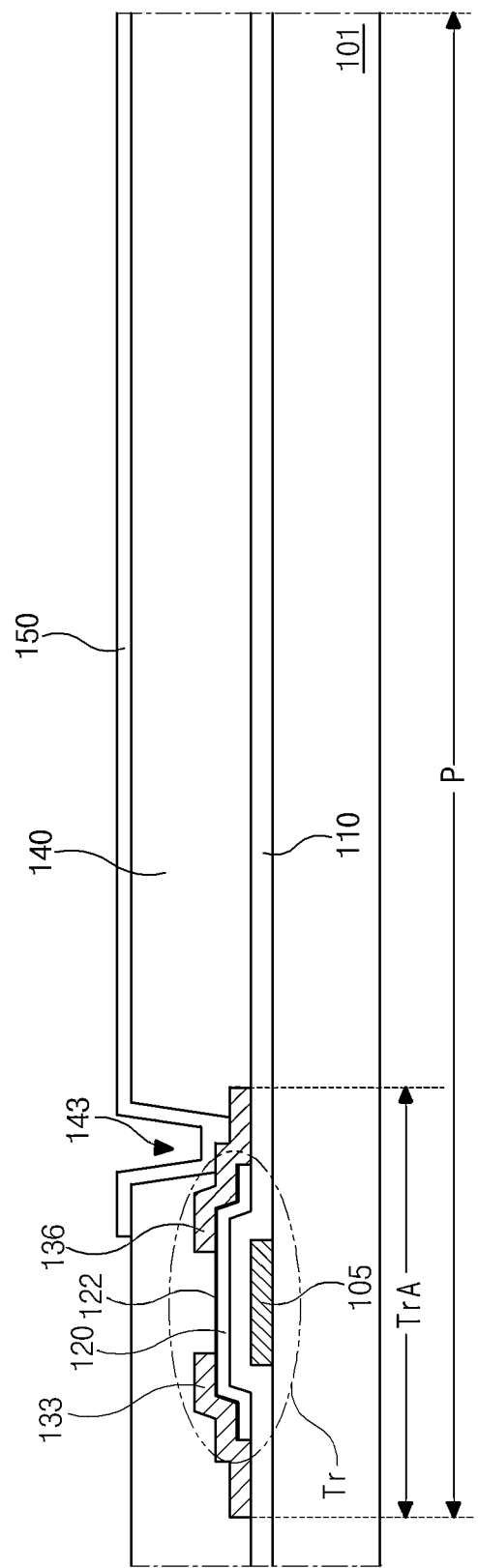

In FIG. 4I, a transparent conductive material layer is formed on the passivation layer 140 having the drain contact hole 143 by depositing a transparent conductive material, for example, indium tin oxide (ITO) or indium zinc oxide (IZO) on a substantially entire surface of the structure of FIG. 4H. The transparent conductive material layer is patterned through a mask process, thereby forming a pixel electrode 150 in the pixel region P. The pixel electrode 150 contacts the drain electrode 136 through the drain contact hole 143. Accordingly, the array substrate according to the first embodiment of the present invention is completed.

As discussed above, the above-mentioned array substrate including the thin film transistor Tr having the oxide semiconductor layer 120 according to the present invention is manufactured by five (5) mask processes: a first mask process is used for forming the gate electrode, a second mask process is used for forming the oxide semiconductor layer and the etch-prevention layer, a third mask process is used for forming the source and drain electrodes, a fourth mask process is used for forming the contact hole in the drain electrode, and a fifth mask process is used for forming the pixel electrode. In the manufacturing method of the array substrate according to the first embodiment of the present invention, one mask process is omitted as compared with the manufacturing method of the related art array substrate including a thin film transistor having an oxide semiconductor layer and an etch stopper, which uses the six (6) mask processes. Therefore, the manufacturing processes are simplified, and the manufacturing costs are reduced using the present invention.

FIGS. 6A to 6H are cross-sectional views of illustrating a method of forming an array substrate including a thin film transistor with an oxide semiconductor layer according to a second embodiment of the present invention. FIGS. 6A to 6H show a pixel region including such a thin film transistor. For convenience of explanation, the same parts as the first embodiment are designated by the similar references to the first embodiments. Steps of forming a gate line and a gate electrode, forming a gate insulating layer, and forming an oxide semiconductor material layer in the second embodiment are the same as the first embodiment, and thus for the sake of brevity, the explanations for these same steps will be omitted or at minimal.

Figure 6A:
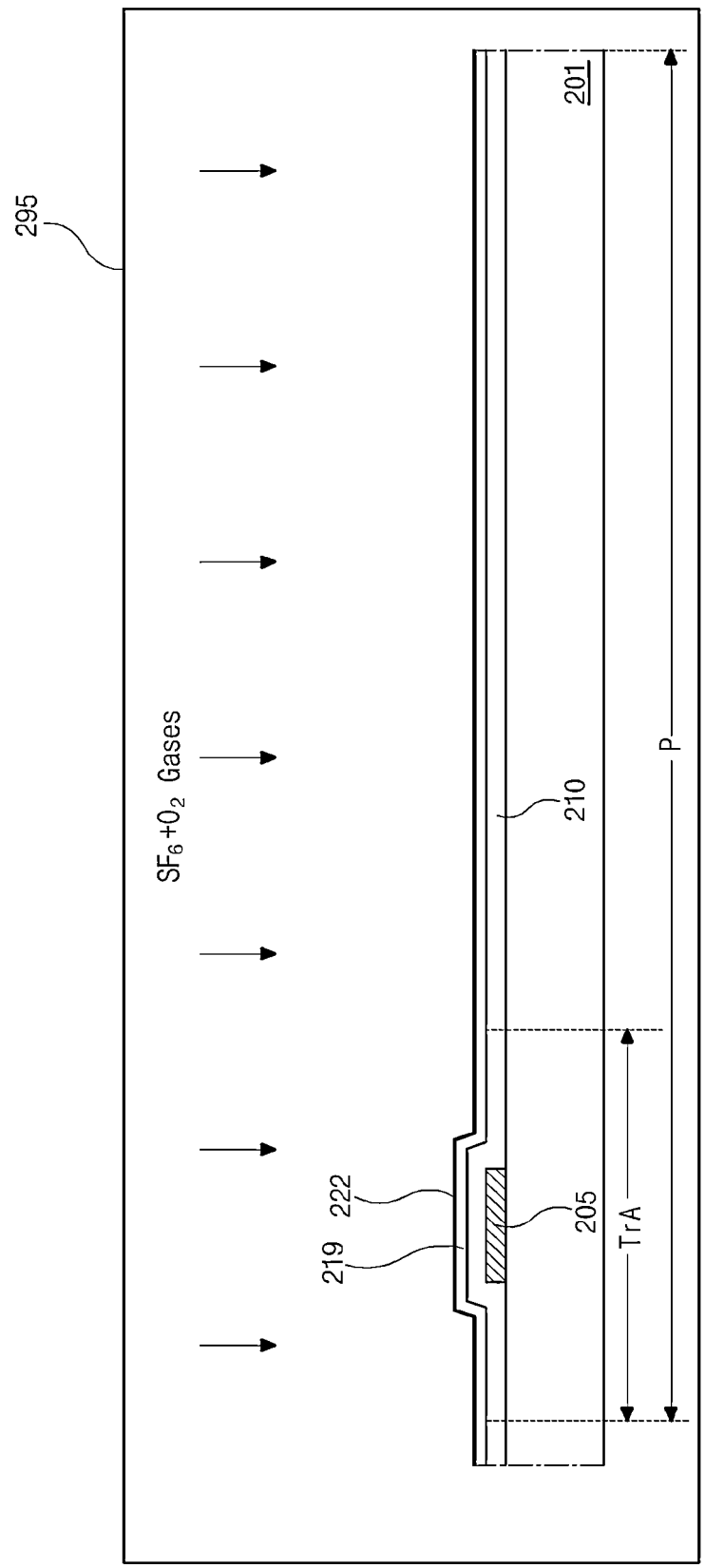

In FIG. 6A, a gate electrode 205 and a gate line are formed on a substrate 201, a gate insulating layer 210 is formed on the gate electrode 205 and the gate line, and an oxide semiconductor material layer 219 is formed on the gate insulating layer 210. The substrate 201 including the oxide semiconductor material layer 219 thereon is disposed in a vacuum chamber 295. The top surface of the oxide semiconductor material layer 219 is treated by supplying sulfur hexafluoride ($SF_6$) and oxygen ($O_2$) gases to the vacuum chamber 295 and generating plasma to thereby form am etch-prevention layer 222 having a certain desired thickness at the top surface of the oxide semiconductor material layer 219. The certain desired thickness of the etch-prevention layer 222 may range from, e.g., 1 nm to 20 nm, and preferably, the thickness of the formed etch-prevention layer 222 may range from 3 nm to 9 nm.

Here, the conditions for treating the top surface of the oxide semiconductor material layer 219 may be the same as those of the first embodiment.

Figure 6B:
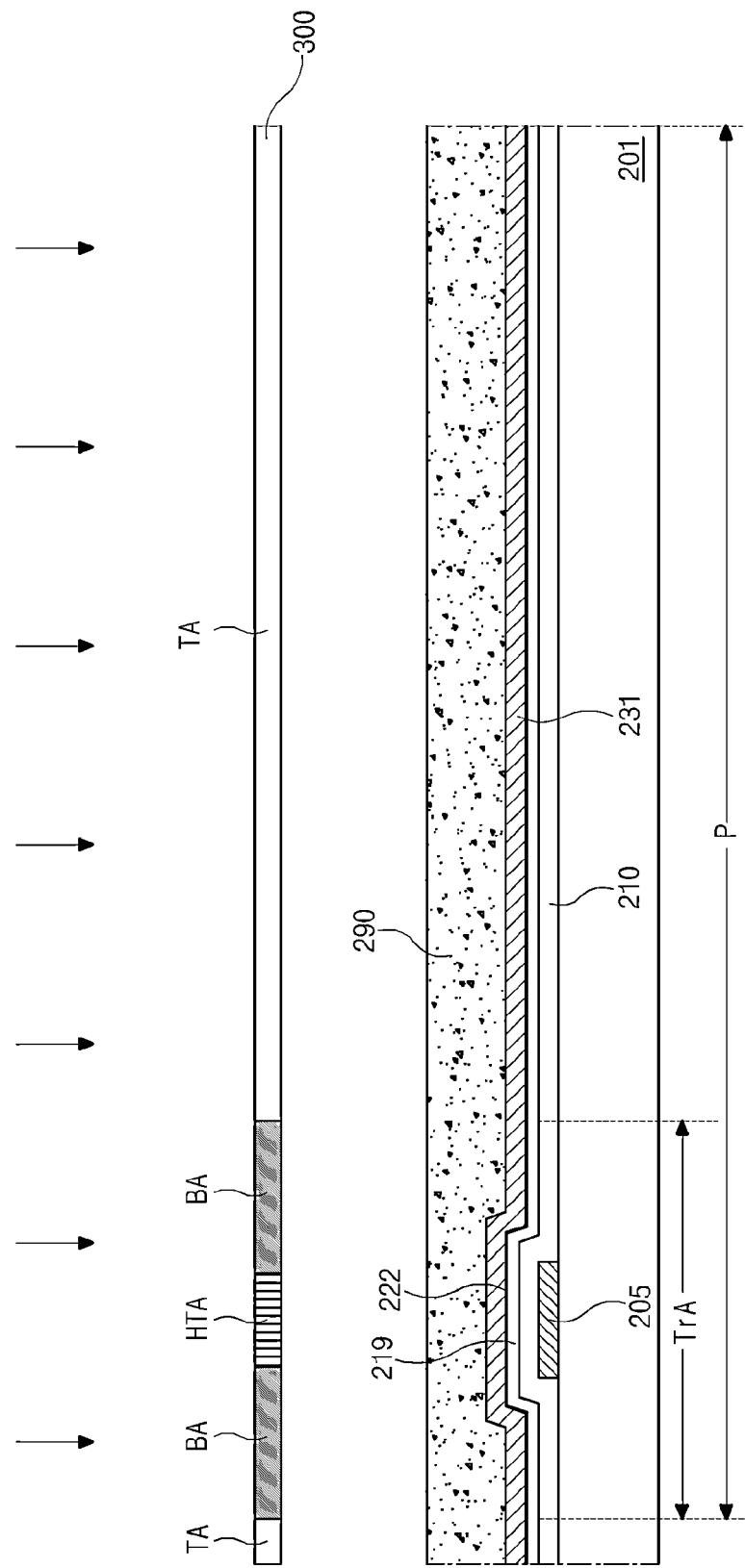

Next, in FIG. 6B, a second metal layer 231 is formed on the oxide semiconductor material layer 219 treated by the plasma of sulfur hexafluoride ($SF_6$) and oxygen ($O_2$) by depositing one or more selected from a metallic material group including copper (Cu), copper alloy, aluminum (Al), aluminum alloy such as aluminum neodymium (AlNd), molybdenum (Mo) and molybdenum ally such as molybdenum titanium (MoTi). The second metal layer 231 may have a single-layered structure or a double-layered structure, and in the figure, the second metal layer 231 has a single-layered structure, for example.

Then, a photoresist layer 290 is formed on the second metal layer 231. The photoresist layer 290 is exposed to light through a mask 300, which includes a light-transmitting portion TA, a light-blocking portion BA and a half light-transmitting portion HTA. The half light-transmitting portion (or a semi light-transmitting portion) HTA may include slits or a multiple-coating layer to control the intensity of light passing therethrough and may have a light transmittance larger than the light-blocking portion BA and smaller than the light-transmitting portion TA.

Figure 6C:
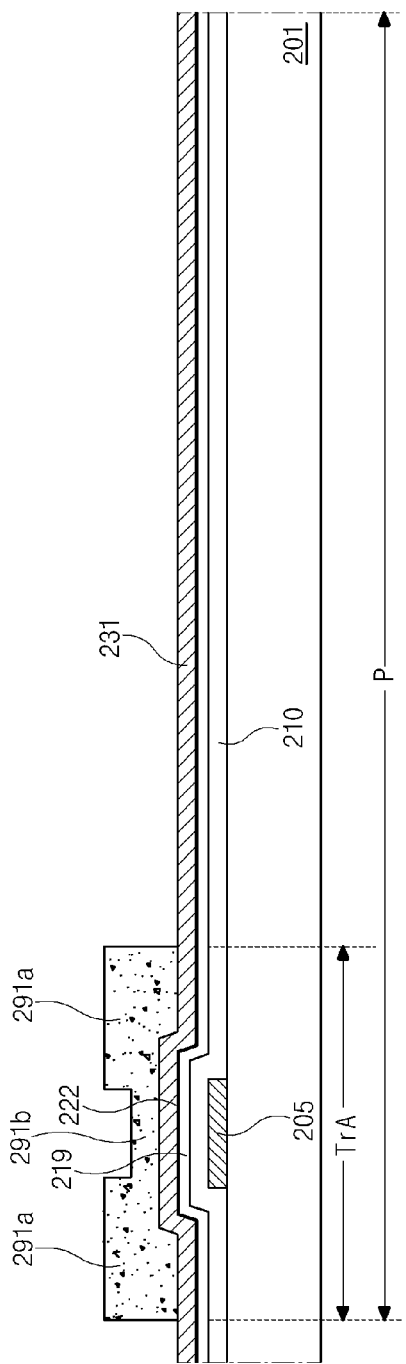

Next, in FIG. 6C, the light-exposed photoresist layer 290 of FIG. 6B is developed, thereby for a first photoresist pattern 291a and a second photoresist pattern 291b on the second metal layer 231. The first photoresist pattern 291a has a first thickness, and the second photoresist pattern 291b has a second thickness thinner than the first thickness. The first photoresist pattern 291a corresponds to areas where a data line and source and drain electrodes at the switching region TrA are to be formed, and the second photoresist pattern 291b corresponds to an area between the source and drain electrodes at the switching region TrA. The second photoresist pattern 291b may correspond to the gate electrode 205. The portions of the photoresist layer 290 of FIG. 6B corresponding to other areas are removed to thereby expose the second metal layer 231.

Figure 6D:
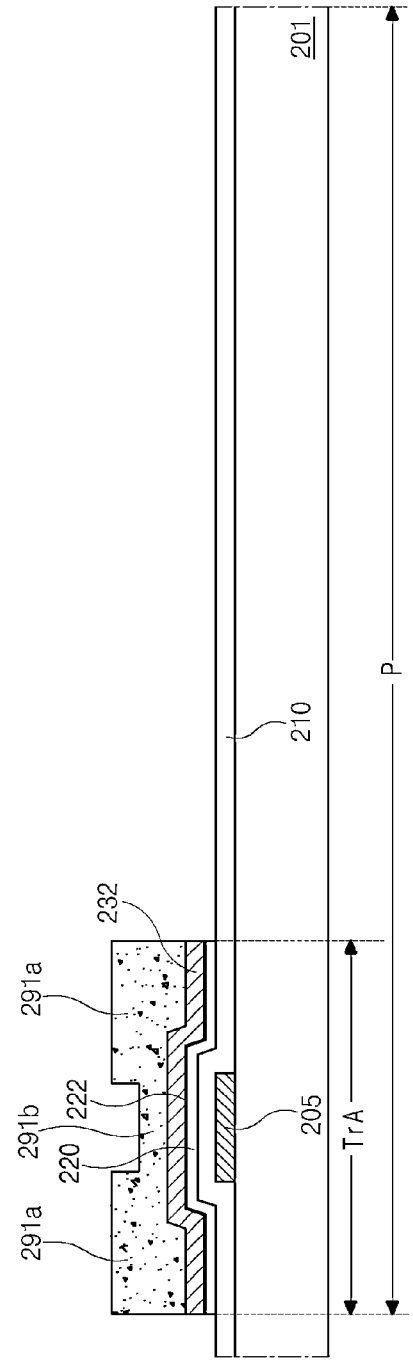

In FIG. 6D, the second metal layer 231 of FIG. 6C exposed by the first and second photoresist patterns 291a and 291b is exposed to an etchant by using the first and second photoresist patterns 291a and 291b as an etching mask. Portions of the second metal layer 231 of FIG. 6C exposed to the etchant react with the etchant and are removed from the substrate 201 to thereby expose the oxide semiconductor material layer 219 of FIG. 6C. Portions of the second metal layer 231 shielded by the first and second photoresist patterns 291a and 291b are not exposed to the etchant and remain on the substrate 201.

Next, the portions of the oxide semiconductor material layer 219 of FIG. 6C that were exposed as the portions of the second metal layer 231 of FIG. 6C were removed, are removed. As a result, portions of the gate insulating layer 219 around the transistor area TrA are exposed.

After the above-mentioned steps, a data line, a source drain pattern 232 and an oxide semiconductor layer 220 are formed on the gate insulating layer 210. The data line is formed along a second direction and crosses the gate line to define the pixel region P. The source drain pattern 232 is disposed at the switching region TrA and is connected to the data line. The oxide semiconductor layer 220 is disposed under the source drain pattern 232. Also, a dummy pattern of the same material as the oxide semiconductor layer 220 is formed under the data line.

In FIG. 6E, an ashing process is performed to the substrate 201 including the source drain pattern 232 and the data line thereon, and the second photoresist pattern 291b of FIG. 6D having the second thickness is removed, thereby exposing a central portion of the source drain pattern 232 at the switching region TrA. At this time, the first photoresist pattern 291a is also partially removed by the ashing process and remains on the source drain pattern 232 while having a reduced thickness.

In FIG. 6F, the source drain pattern 232 of FIG. 6E exposed by the first photoresist pattern 291a is exposed to an etchant, and the central portion of the source drain pattern 232 of FIG. 6E corresponding to the gate electrode 205 is removed, thereby forming source and drain electrodes 233 and 236 and exposing a portion of the oxide semiconductor layer 220 between the source and drain electrodes 233 and 236. Here, the exposed portion of the oxide semiconductor layer 220 contacts the etchant for removing the source drain pattern 232 of FIG. 6E. However, the oxide semiconductor material layer 210 of FIG. 6A is treated by plasma of sulfur hexafluoride ($SF_6$) and oxygen ($O_2$) gases, and the etch-prevention layer 222 of a predetermined thickness is formed at the top surface of the oxide semiconductor layer 220. Thus, the oxide semiconductor layer 220 does not react with the etchant. Accordingly, the oxide semiconductor layer 220 is not removed and the inside of the oxide semiconductor layer 220 is not damaged by the etchant. The thickness of the etch-prevention layer 222 may range from, e.g., 1 nm to 20 nm, and preferably, the thickness of the etch-prevention layer 222 may range from 3 nm to 9 nm.

The gate electrode 205, the gate insulating layer 210, the oxide semiconductor layer 220, and the source and drain electrodes 233 and 236 constitute a thin film transistor Tr, a switching element.

In FIG. 6G, the first photoresist pattern 291a of FIG. 6F on the data line and the source and drain electrodes 233 and 236 are stripped and removed, thereby exposing the data line and the source and drain electrodes 233 and 236.

In FIG. 6H, a passivation layer 240 is formed on the data line and the source and drain electrodes 233 and 236 by depositing an inorganic insulating material such as silicon oxide ($SiO_2$) or silicon nitride ($SiN_X$), or applying an organic insulating material such as benzocyclobutene (BCB) or photo acryl. In the figure, the passivation layer 240 is formed of an organic insulating material and has an even surface, for example. If the passivation layer 240 is formed of an inorganic material, the passivation layer 240 may have an uneven surface due to the steps of the layers under the passivation layer 240.

The passivation layer 240 is patterned through a mask process, thereby forming a drain contact hole 243 exposing a part of the drain electrode 236 at the switching region TrA.

Next, a transparent conductive material layer is formed on the passivation layer 240 having the drain contact hole 243 by depositing a transparent conductive material, for example, indium tin oxide (ITO) or indium zinc oxide (IZO) on a substantially entire surface of the structure including the substrate 201. The transparent conductive material layer is patterned through a mask process, thereby forming a pixel electrode 250 in the pixel region P. The pixel electrode 250 contacts the drain electrode 236 through the drain contact hole 243. Accordingly, the array substrate according to the second embodiment of the present invention is completed.

The above-mentioned array substrate according to the second embodiment is manufactured by using four (4) mask processes: a first mask process is used for forming the gate electrode, a second mask process is used for forming the oxide semiconductor layer, the etch-prevention layer, and the source and drain electrodes, a third mask process is used for forming the contact hole in the drain electrode, and a fourth mask process for forming the pixel electrode. In the manufacturing method of the array substrate according to the second embodiment, two mask processes are omitted as compared with the manufacturing method of the related art array substrate including a thin film transistor having an oxide semiconductor layer and an etch stopper where the six mask processes are used. Therefore, the manufacturing processes are simplified, and the manufacturing costs are reduced according to the present invention. Moreover, the oxide semiconductor material layer is treated by sulfur hexafluoride ($SF_6$) and oxygen ($O_2$) plasma, and even if the oxide semiconductor layer is exposed to the etchant for etching the metal material, the oxide semiconductor layer does not react with the etchant and is not damaged.

Figure 7A:
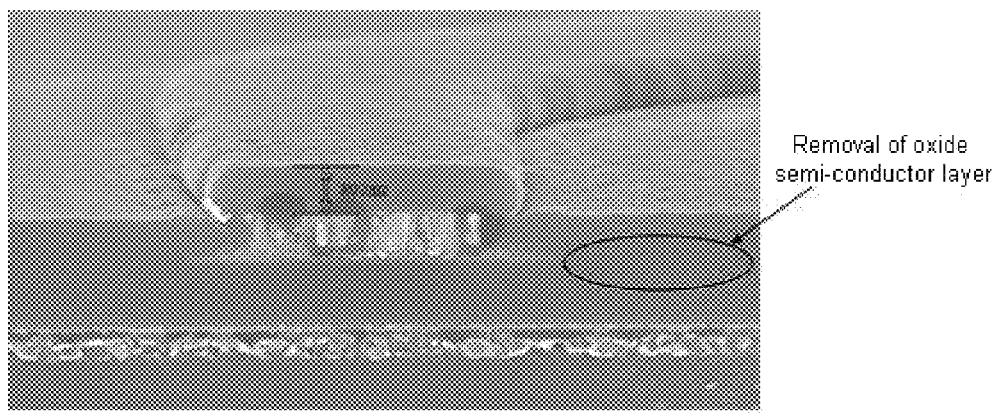
FIG. 7A and FIG. 7B are pictures depicting examples of the cross-sectional views of array substrates according to the related art and the present invention, respectively, after forming source and drain electrodes of the thin film transistors.
Figure 7B:
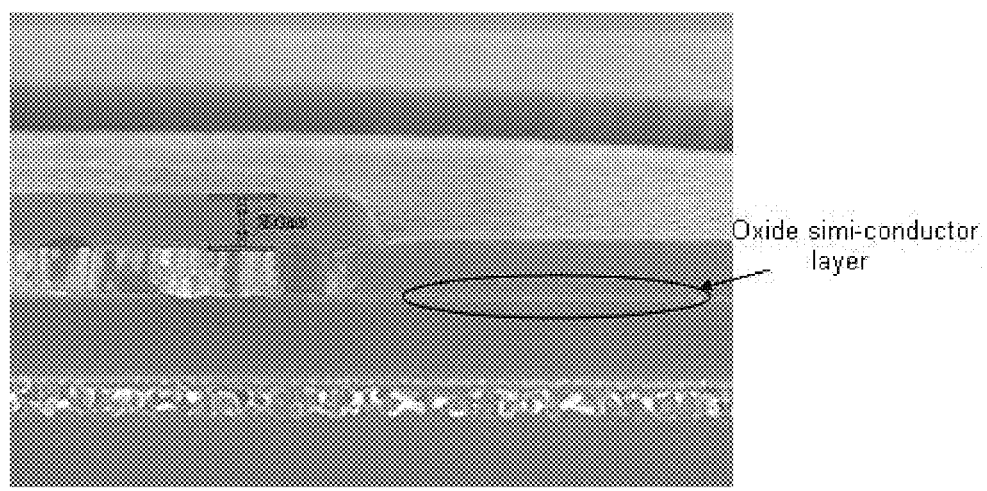

FIG. 7A is a picture of a cross-sectional view of an array substrate after the source and drain electrodes are formed according to the related art, and FIG. 7B are pictures of a cross-sectional view of an array substrates having the thin film transistor according to the present invention.

In FIG. 7A, the oxide semiconductor layer is not treated by sulfur hexafluoride ($SF_6$) and oxygen ($O_2$) plasma. The oxide semiconductor layer is exposed to the etchant for forming the source and drain electrodes and is removed. Thus, the oxide semiconductor layer hardly remains at the switching region.

On the other hand, in FIG. 7B, the oxide semiconductor layer, more particularly, the oxide semiconductor material layer is treated by sulfur hexafluoride ($SF_6$) and oxygen ($O_2$) plasma. Thus even though the oxide semiconductor layer is exposed to the etchant for forming the source and drain electrodes, the oxide semiconductor layer is not removed.

In the present invention, the surface of the oxide semiconductor layer is treated by plasma, and thus the oxide semiconductor layer does not react with an etchant for removing a metallic material. Therefore, the oxide semiconductor layer is not damaged by the etchant, and the characteristics of the thin film transistor are not deteriorated.

Furthermore, an etch stopper, which prevents the oxide semiconductor layer from being exposed to the etchant, can be omitted due to the plasma treatment, and in the manufacturing method of an array substrate according to the present invention, one or two mask processes can be eliminated as compared with the manufacturing method of an array substrate according to the related art. Accordingly, the manufacturing processes can be simplified, and the manufacturing costs are decreased according to the present invention.

The array substrate according to the present invention can be used for flat panel display (FPD) devices such as organic electroluminescent display (OLED) devices, liquid crystal display (LCD) devices and electrophoretic display (EPD) devices.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating an array substrate, comprising:
   forming a gate electrode on a substrate;
   forming a gate insulating layer on the gate electrode;
   forming an oxide semiconductor layer material on the gate insulating layer;
   turning an upper portion of the oxide semiconductor layer material into an etch prevention layer material;
   forming a metal layer on the etch prevention layer material;
   forming an oxide semiconductor layer, an etch prevention layer, and source and drain electrodes by patterning the oxide semiconductor layer material, the etch prevention layer material and the metal layer using a single mask;
   forming a passivation layer including a contact hole on the source and drain electrodes and the gate insulating layer; and
   forming a pixel electrode on the passivation layer and through the contact hole.

2. The method according to claim 1, wherein the turning step includes applying a plasma treatment on the oxide semiconductor layer material.

3. The method according to claim 2, wherein the plasma treatment involves applying a sulfur hexafluoride ($SF_6$) and oxygen ($O_2$) plasma.

4. The method according to claim 1, wherein all the steps are performed using four mask processes.

5. The method according to claim 1, wherein the array substrate is an array substrate of a liquid crystal display device or an array substrate of an organic electroluminescent display device.

6. The method according to claim 1, wherein the etch prevention layer has a thickness of about 1 to 20 nanometers.

7. The method according to claim 1, wherein ends of the source and drain electrodes are aligned with ends of the etch prevention layer.

8. The method according to claim 1, wherein the single mask includes a light-transmitting portion, a light-blocking portion and a half light-transmitting portion.

* * * * *